United States Patent

Sakuraba et al.

Patent Number: 6,054,762
Date of Patent: Apr. 25, 2000

[54] SEMICONDUCTOR SUBSTRATES OF HIGH RELIABILITY CERAMIC METAL COMPOSITES

[75] Inventors: Masami Sakuraba; Masami Kimura; Junji Nakamura; Masaya Takahara, all of Shiojiri, Japan

[73] Assignee: Dowa Mining Co., Ltd., Tokyo, Japan

[21] Appl. No.: 08/917,327

[22] Filed: Aug. 25, 1997

[30] Foreign Application Priority Data

Aug. 27, 1996 [JP] Japan .................................... 8-244076
Mar. 18, 1997 [JP] Japan .................................... 9-084389

[51] Int. Cl.$^7$ ............................ H01L 23/06; H01L 23/10; H01L 23/15; H01L 23/34
[52] U.S. Cl. .......................... 257/703; 361/750; 361/751; 361/784; 361/792; 257/700; 257/705; 257/712
[58] Field of Search .................................... 257/703, 700, 257/705, 712; 361/784, 792, 750, 751

[56] References Cited

U.S. PATENT DOCUMENTS

| | | | |
|---|---|---|---|
| 4,837,408 | 6/1989 | Kondo et al. | 361/792 |
| 5,012,324 | 4/1991 | Martin et al. | |
| 5,402,318 | 3/1995 | Otsuka et al. | 361/792 |
| 5,578,796 | 11/1996 | Bhatt et al. | 361/792 |
| 5,686,758 | 11/1997 | Arai et al. | 257/703 |
| 5,751,059 | 5/1998 | Prost | 257/703 |

FOREIGN PATENT DOCUMENTS

| | | |
|---|---|---|
| 407 905 | 1/1991 | European Pat. Off. . |
| 789 397 | 8/1997 | European Pat. Off. . |
| 1-59986 | 3/1989 | Japan . |
| 64-59986 | 3/1989 | Japan . |
| 7-93326 | 10/1995 | Japan . |
| 7-77989 | 8/1997 | Japan . |
| WO 89/00339 | 1/1989 | WIPO . |

OTHER PUBLICATIONS

Patent Abstracts of Japan, vol. 018, No. 188 (E–1532), Mar. 31, 1994, of JP 05 347469 (Toshiba Corp.), Dec. 27, 1993.

Primary Examiner—Teresa M. Arroyo
Attorney, Agent, or Firm—Frishauf, Holtz, Goodman, Langer & Chick, P.C.

[57] ABSTRACT

A paste of active metallic brazing material is applied to the entire surface of each side of aluminum nitride or alumina ceramic substrate 1; circuit forming copper plate 3 having a thickness of 0.3 mm is placed in contact with one surface of the substrate and a heat dissipating copper plate 4 having a thickness of 0.25 mm placed in contact with the other surface; the individual members are compressed together and heated at 850° C. in a vacuum furnace to form a joint; an etching resist is applied to the circuit forming copper plate and etching is performed with an iron chloride solution to form a circuit pattern and the unwanted brazing material is removed from the marginal portions; a second resist layer is applied and etched with an iron chloride solution to form a second marginal step; a third resist layer is similarly applied and etched to form a third marginal step; the completed circuit board having three marginal steps of which the lowest one is solely or partly made of the brazing material can withstand 1,500 heat cycles, which is the result that has ben unattainable by the prior art. Having such high heat cycle characteristics, the circuit board is suitable for use as semiconductor substrate in automobiles, electric trains and other applications that require high output power.

13 Claims, 4 Drawing Sheets (B)

(A)

SEMICONDUCTOR SUBSTRATES OF HIGH RELIABILITY CERAMIC METAL COMPOSITES

BACKGROUND OF THE INVENTION

1. Field of the Invention

This invention relates to circuit substrates made of high-strength ceramic-metal composites. More particularly, the invention relates to semiconductor substrates of high reliability that have sufficiently high heat cycle characteristics to be suitable for use as circuit boards in automobiles, electric trains and other applications that require high output power.

2. Background of the Information

Ceramic circuit substrates having current conducting circuits are extensively used for mounting electronic components that generate large amounts of heat such as power hybrid ICs and power modules. In recent years, various design considerations have been adopted in the fabrication of ceramic substrates and the formation of current carrying circuits with a view to manufacturing AlN ceramic circuit boards having high heat conductivity.

For the particular purpose of improving the heat cycle characteristics, Examined Japanese Patent Publication No. 93326/1995 and Unexamined Published Japanese Patent Application No. 59986/1989 proposed that marginal portions of a metal plate as a principal component of a circuit board are provided with two steps or a thin-walled area in cross section. Alternatively, a fillet may be provided in order to relieve the thermal stress at the marginal portions as taught by the Assignee in Examined Japanese Patent Publication No. 77989/1995 entitled "Process for the Production of Ceramic-Metal Joints".

It has been reported that the circuit boards manufactured by those methods are improved in heat cycle characteristics compared to the circuit boards having no steps at all in the marginal portions and can withstand up to several hundred cycles without cracking. However, the recent versions of circuit boards for handling large power or those to be used in automobiles are required to have even higher operational reliability and withstand at least 1,500 heat cycles and no satisfactory substrates have so far been developed by adopting the above-described methods.

In short, it has been common sense in the art that fifty to several hundred heat cycles are the maximum limit that can be withstood by the circuit boards fabricated by the conventional methods and it has been difficult to use them as commercial power modules in automobiles, electric trains and other applications that require high output power.

SUMMARY OF THE INVENTION

The present invention has been accomplished under these circumstances and has as an object providing a power module circuit board that can withstand at least 1,500 heat cycles and which, hence, is suitable for use in automobiles and electric trains.

The present inventors conducted intensive studies in order to attain the stated object and found that the heat cycle characteristics of a circuit board could be markedly improved by providing at least three steps in its marginal portions and also specifying their thickness and width. The present invention has been accomplished on the basis of this finding.

Thus, the present invention relates generally to a semiconductor substrate of high reliability which comprises a ceramic to metal joined circuit board having three or more steps formed in the marginal portions of at least the conductor circuit.

In a preferred embodiment, the lowest step in the marginal portions of the conductor circuit is made of an active metallic brazing material whereas the other steps are made of a metal or metals.

In another preferred embodiment, all steps in the marginal portions of the conductor circuit are made of a metal or metals.

In the first preferred embodiment, the lowest step is made of an active metallic brazing material, with the active metal being at least one of Ti, Zr and Hf, whereas the other steps are made of a metal or metals.

In yet another preferred embodiment, the lowest step has a thickness $t_1$ which accounts for no more 15% of the total thickness of the conductor and has a width $l_1$ of 5–500 μm, the middle step has a thickness $t_2$ which accounts for 25–55% of the total thickness of the conductor and has a width $l_2$ of 100–500 μm, and the highest step has a thickness $t_3$ which accounts for 30–60% of the total thickness of the conductor, with $t_1+t_2$ being no more than 70% of the total thickness of the conductor and $l_1+l_2$ being no more than 1 mm.

DETAILED DESCRIPTION OF THE INVENTION

Figure 1A:
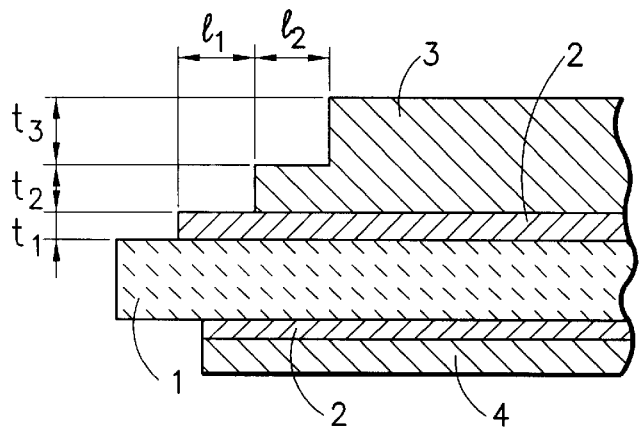
FIG. 1A shows in partial section the marginal profiles of the circuit boards fabricated in Examples 1, 3 and 7.

The ceramic substrate to be used in the invention is either an alumina substrate or a nitride ceramic substrate comprising aluminum nitride or silicon nitride. The conductor circuit is formed of a metal (i.e., Cu) plate.

In the present invention, three or more steps can be formed in the marginal portions of a conductor circuit by two different methods depending on how the copper plate is joined to a ceramic substrate. In an active metal process in which the copper plate is joined to the ceramic substrate using an active metallic brazing material, the following method is employed: a paste of the active metallic brazing material is applied to the entire surface on either side of the ceramic substrate (e.g. aluminum nitride or alumina); a circuit forming copper plate 0.3 mm thick is placed in contact with one surface of the substrate and a heat dissipating copper plate 0.25 mm thick in contact with the other surface; the three members are compressed together and heated at 850° C. in a vacuum furnace to form a joint; an etching resist is applied to the circuit forming copper plate on the joint and after etching with an iron chloride solution to form a circuit pattern, the unwanted brazing material is removed from the marginal portions to form a first marginal step; then, a second resist layer is applied and etching is performed on the circuit forming Cu plate with an iron chloride solution to form a second marginal step; subsequently, a third resist layer is applied and etching is performed with an iron chloride solution to form a third marginal step. The thus completed conductor circuit has the lowest marginal step formed solely or partly of brazing material. By varying the etching condition, the first marginal step (i.e., the lowest step) can be formed of either a single layer of the brazing material or a dual layer consisting of the brazing material and copper in a desired thickness.

In a direct bonding process in which the copper plate is joined directly to the ceramic substrate, the following method is employed: a circuit forming copper plate 0.3 mm thick is placed in contact with one surface of the ceramic (typically alumina) substrate and a heat dissipating copper plate 0.25 mm thick placed in contact with the other surface; the three members are compressed together and heated at 1,063° C. in a heating furnace to form a joint; then, as in the active metal process, an etching resist is applied to the circuit forming copper plate on the joint and etching is performed with an iron chloride solution to form a circuit pattern having a first marginal step; subsequently, a second resist layer is applied and etching is performed with an iron chloride solution to form a second marginal step; finally, a third resist layer is applied and etching is performed with an iron chloride solution to form a third marginal step. The thus completed circuit board has three steps formed in the marginal portions of the circuit forming Cu plate.

The circuit boards having three steps formed in the marginal portions by the two processes were evaluated for their heat cycle characteristics, with each cycle consisting of heating at 125° C. for 30 minutes and cooling at −40° C. for 30 minutes. They could withstand at least 1,500 cycles, the result being incomparable to the data obtained with the prior art version.

In order to further improve the heat cycle characteristics, marginal steps may be provided not only on the circuit forming copper plate, but also on the heat dissipating copper plate on the other side of the substrate and this is also included within the scope of the invention. When this approach was adopted, the circuit boards, whether they were fabricated by the active metal process or the direct bonding process, could withstand at least 2,000 heat cycles without cracking.

The following examples are provided for the purpose of further illustrating the present invention, but are in no way to be taken as limiting.

EXAMPLE 1

Four aluminum nitride substrates measuring 53×29× 0.635 mm were provided as ceramic substrates 1. A paste of brazing material 2 comprising 71.0% Ag, 16.5% Cu and 2.5% Ti was applied to the entire surface of either side of each substrate. A circuit forming copper plate 3 having a thickness of 0.3 mm was placed in contact with one surface of each substrate and a heat dissipating copper plate 4 having a thickness of 0.25 mm placed in contact with the other surface. The individual members were compressed together and heated at 850° C. in a vacuum furnace to form a joint.

Then, an etching resist was applied to the circuit forming copper plate and etching was performed with an iron chloride solution to form a circuit pattern and the unwanted brazing material removed from the marginal portions.

Then, a second resist layer was applied and etched to form a second marginal step.

A third resist layer was applied and etched to form a third marginal step. In this way, two pairs of circuit boards were fabricated which had the marginal profiles shown in FIGS. 1A and 1B with the lowest step being made solely or partly of the brazing material.

The marginal steps in the two circuit boards shown in FIG. 1A had the following dimensions: $t_1$=20 μm and $l_1$=0.3 mm for the lowest step; $t_2$=0.1 mm and $l_2$=0.3 mm for the middle step; and $t_3$=0.18 mm for the highest step.

Figure 1B:
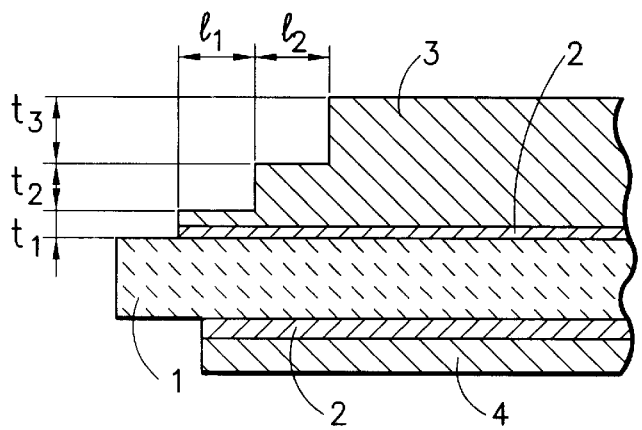
FIG. 1B shows in partial section the marginal profiles of the circuit boards fabricated in Examples 1 and 3.

The marginal steps in the two circuit boards shown in FIG. 1B had the following dimensions: $t_1$=40 μm and $l_1$=0.3 mm for the lowest step; $t_2$=0.13 mm and $l_2$=0.3 mm for the middle step; and $t_3$=0.13 mm for the highest step.

One member of each of the circuit board pairs shown in FIGS. 1A and 1B was subjected to a heat cycle test, each cycle consisting of heating at 125° C. for 30 minutes and cooling at −40° C. for 30 minutes. The results are shown in Table 1; both circuit boards could withstand up to 1,500 cycles without cracking and fine cracks developed only after 2,000 cycles.

EXAMPLE 2

Figure 2A:
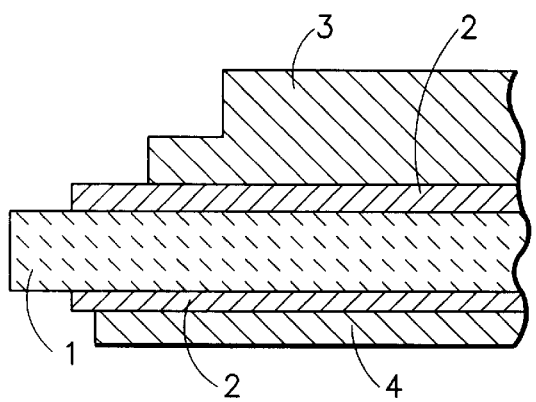
FIG. 2A shows in partial section the marginal profiles of the circuit boards fabricated in Examples 2 and 8.
Figure 2B:
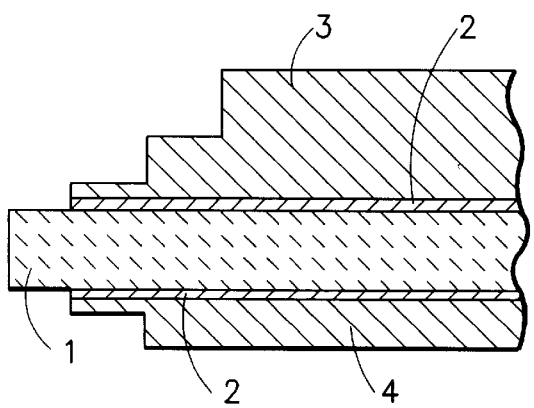
FIG. 2B shows in partial section the marginal profiles of the circuit boards fabricated in Example 2.

The other member of each of the circuit board pairs fabricated in Example 1 was further treated to form two steps in the marginal portions of the heat dissipating surface on the opposite side by resist application and etching (see FIGS. 2A and 2B). The heat cycle characteristics of these circuit boards were tested by the same method as in Example 1. The results are also shown in Table 1; both circuit boards could withstand up to 2,000 cycles without cracking, thus proving to possess by far better heat cycle characteristics than the prior art version.

EXAMPLE 3

Four alumina substrates measuring 53×29×0.635 mm were provided as ceramic substrates 1. A paste of brazing material 2 comprising 71.0% Ag, 16.5% Cu and 2.5% Ti was applied to the entire surface of either side of each substrate. A circuit forming copper plate 3 having a thickness of 0.3 mm was placed in contact with one surface of each substrate and a heat dissipating copper plate 4 having a thickness of 0.25 mm placed in contact with the other surface. The individual members were compressed together and heated at 850° C. in a vacuum furnace to form a joint.

Then, an etching resist was applied to the circuit forming copper plate and etching was performed with an iron chloride solution to form a circuit pattern and the unwanted brazing material removed from the marginal portions.

Then, a second resist layer was applied and etched to form a second marginal step.

A third resist layer was applied and etched to form a third marginal step. In this way, two pairs of circuit boards were fabricated which had the marginal profiles shown in FIGS. 1A and 1B with the lowest step being made solely or partly of the brazing material.

The marginal steps in the two circuit boards shown in FIG. 1A had the following dimensions: $t_1$=20 μm and $l_1$=0.3 mm for the lowest step; $t_2$=0.1 mm and $l_2$=0.3 mm for the middle step; and $t_3$=0.18 mm for the highest step.

The marginal steps in the two circuit boards shown in FIG. 1B had the following dimensions: $t_1$=40 μm and $l_1$=0.3 mm for the lowest step; $t_2$=0.13 mm and $l_1$=0.3 mm for the middle step; and $t_3$=0.13 mm for the highest step.

One member of each of the circuit board pairs shown in FIGS. 1A and 1B was subjected to a heat cycle test, each cycle consisting of heating at 125° C. for 30 minutes and cooling at −40° C. for 30 minutes. The results are shown in Table 1; both circuit boards could withstand up to 1,500 cycles without cracking and fine cracks developed only after 2,000 cycles.

EXAMPLE 4

Figure 4A:
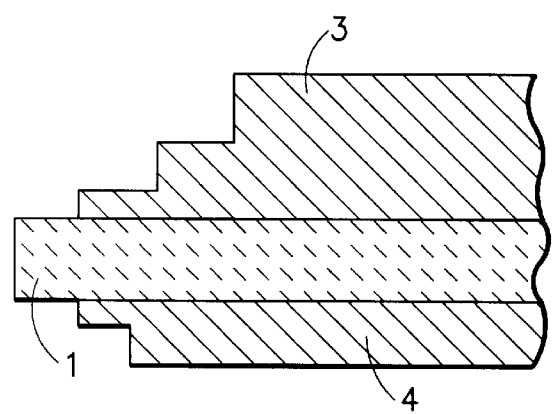
FIGS. 4A and 4B show in partial section the marginal profiles of the circuit boards fabricated in Examples 4 and 6.
Figure 4B:
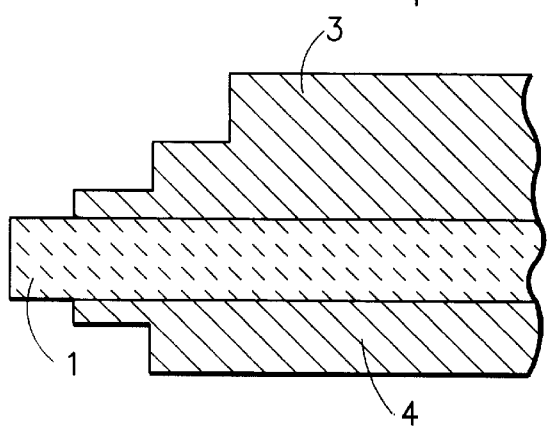

The other member of each of the circuit board pairs fabricated in Example 3 was further treated to form two steps in the marginal portions of the heat dissipating surface on the opposite side by resist application and etching (see FIGS. 4A and 4B). The heat cycle characteristics of these circuit boards were tested by the same method as in Example 3. The results are also shown in Table 1; both circuit boards could withstand up to 2,000 cycles without cracking, thus proving to possess by far better heat cycle characteristics than the prior art versions.

EXAMPLE 5

Four alumina substrates measuring 53×29×0.635 mm were provided as ceramic substrates 1. A circuit forming copper plate 3 having a thickness of 0.3 mm was placed in contact with one surface of each substrate and a heat dissipating copper plate 4 having a thickness of 0.25 mm placed in contact with the other surface. The individual members were compressed together and heated at 1,063° C. in a heating furnace to have the copper plates bonded to the substrate directly.

Then, an etching resist was applied to the circuit forming copper plate and etching was performed with an iron chloride solution to form a circuit pattern having a first step in the marginal portions.

Then, a second resist layer was applied and etched to form a second marginal step.

A third resist layer was applied and etched to form a third marginal step. In this way, two pairs of circuit boards were fabricated which had the marginal profiles shown in FIGS. 3A and 3B.

Figure 3A:
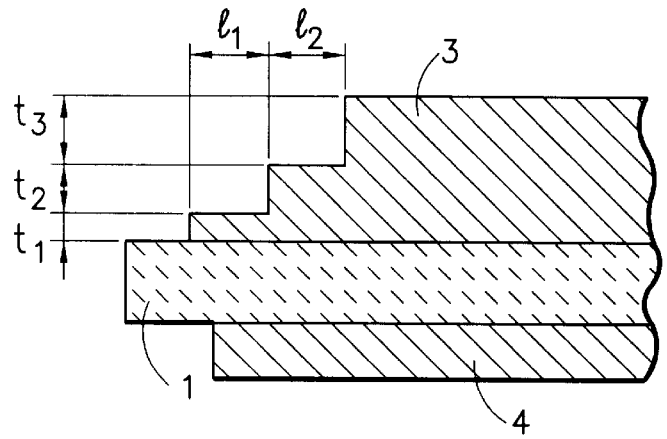
FIGS. 3A and 3B show in partial section the marginal profiles of the circuit boards fabricated in Example 5.

The marginal steps in the two circuit boards shown in FIG. 3A had the following dimensions: $t_1$=20 μm and $l_1$=0.3 mm for the lowest step; $t_2$=0.1 mm and $l_2$=0.3 mm for the middle step; and $t_3$=0.18 mm for the highest step.

Figure 3B:
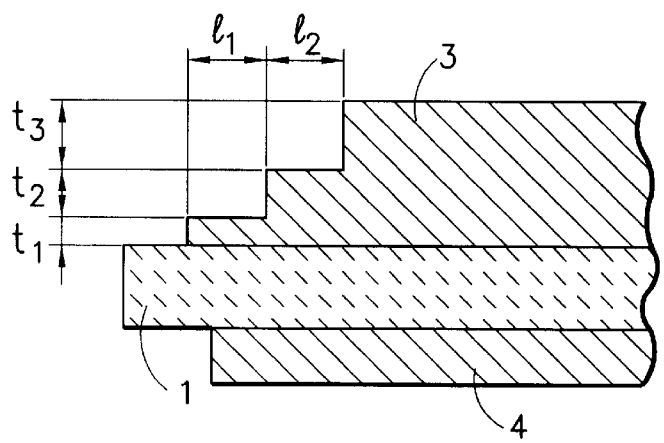

The marginal steps in the two circuit boards shown in FIG. 3B had the following dimensions: $t_1$=40 μm and $l_1$=0.3 mm for the lowest step; $t_2$=0.13 mm and $l_2$=0.3 mm for the middle step; and $t_3$=0.13 mm for the highest step.

One member of each of the circuit board pairs shown in FIGS. 3A and 3B was subjected to a heat cycle test, each cycle consisting of heating at 125° C. for 30 minutes and cooling at −40° C. for 30 minutes. The results are shown in Table 1; both circuit boards could withstand up to 1,500 cycles without cracking and fine cracks developed only after 2,000 cycles.

EXAMPLE 6

The other member of each of the circuit board pairs fabricated in Example 5 was further treated to form two steps in the marginal portions of the heat dissipating surface on the other side by resist application and etching (see FIGS. 4A and 4B). The heat cycle characteristics of these circuit boards were tested by the same method as in Example 5. The results are also shown in Table 1; both circuit boards could withstand up to 2,000 cycles without cracking, thus proving to possess by far better heat cycle characteristics than the prior art versions.

EXAMPLE 7

Two aluminum nitride substrates measuring 53×29×0.635 mm were provided as ceramic substrates 1. A paste of brazing material 2 comprising 71.0% Ag, 16.5% Cu, 2.0% Ti and 0.5% $TiO_2$ was applied to the entire surface of either side of each substrate. A circuit forming copper plate 3 having a thickness of 0.3 mm was placed in contact with one surface of each substrate and a heat dissipating copper plate 4 having a thickness of 0.25 mm placed in contact with the other surface. The individual members were compressed together and heated at 850° C. in a vacuum furnace to form a joint.

Then, an etching resist was applied to the circuit forming copper plate and etching was performed with an iron chloride solution to form a circuit pattern and the unwanted brazing material removed from the marginal portions.

Then, a second resist layer was applied and etched to form a second marginal step.

A third marginal step was then formed by exclusively removing the Cu component with a chemical polishing solution, thereby fabricating two circuit boards which had the marginal profile shown in FIG. 1A with the lowest step being made solely of the brazing material.

The marginal steps in each circuit boards had the following dimensions: $t_1$=20 μm and $l_1$=0.3 mm for the lowest step; $t_2$=0.095 mm and $l_2$=0.3 mm for the middle step; and $t_3$=0.175 mm for the highest step.

One of the fabricated circuit boards was subjected to a heat cycle test, each cycle consisting of heating at 125° C. for 30 minutes and cooling at −40° C. for 30 minutes. The results are shown in Table 1; the circuit board could withstand up to 1,500 cycles without cracking and fine cracks developed only after 2,000 cycles.

EXAMPLE 8

The other of the two circuit boards fabricated in Example 7 was further treated to form two marginal steps on the heat dissipating side by application of two resist layers and etching (see FIG. 2A).

The heat cycle characteristics of the circuit board were tested by the same method as in Example 7 and the results are also shown in Table 1. The circuit board could withstand 2,000 cycles without cracking, thus proving to possess by far better heat cycle characteristics than the prior art version.

COMPARATIVE EXAMPLE 1

Aluminum nitride and alumina substrates each measuring 53×29×0.635 mm were provided as ceramic substrates 1. In the active metal process, a paste of the same active metallic brazing material 2 as used in Example 1 was applied to the entire surface of either side of the AlN substrate; a circuit forming copper plate 3 having a thickness of 0.3 mm and a heat dissipating copper plate 4 having a thickness of 0.25 mm were placed in contact with opposite sides of the substrate; the individual members were compressed together and heated at 850° C. in a vacuum furnace to form a joint.

In the direct bonding process, the circuit forming copper plate 3 and the heat dissipating copper plate 4 of the thicknesses specified above were placed in opposite sides of the $Al_2O_3$ substrate; and the individual members were compressed together and heated at 1,063° C. in a heating furnace to form a joint.

Figure 5A:
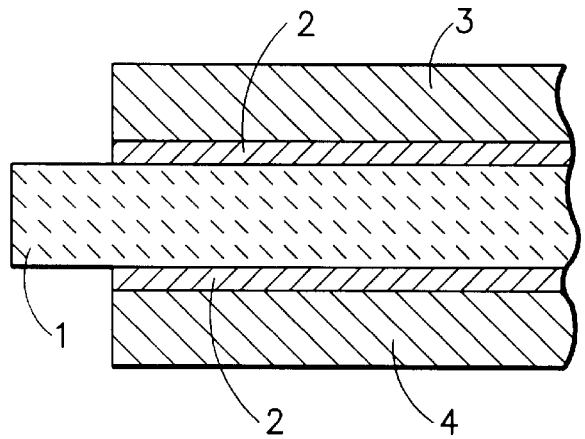
FIGS. 5A and 5B show in partial section the marginal profiles of the circuit boards fabricated in Comparative Example 1.
Figure 5B:
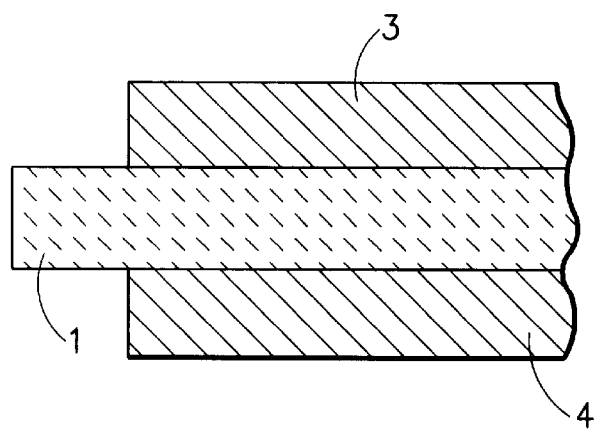

An etching resist was applied to the circuit forming Cu plate 3 on each joint and etching was performed with an iron chloride solution to fabricate two circuit boards of the conventional types illustrated in FIGS. 5A and 5B. Their heat cycle characteristics were tested by the same method as in Example 1 and fine cracks were found to develop upon application of about 50 cycles.

COMPARATIVE EXAMPLE 2

Two aluminum nitride substrates measuring 53×29×0.635 mm were provided as ceramic substrates 1. A paste of brazing material 2 comprising 71.0% Ag, 16.5% Cu and 2.5% Ti was applied to the entire surface of either side of each substrate. A circuit forming copper plate 3 having a thickness of 0.3 mm and a heat dissipating copper plate 4 having a thickness of 0.25 mm were placed in contact with opposite sides of each substrate, and the individual members were compressed together and heated at 850° C. in a vacuum furnace to form a joint.

Then, an etching resist was applied to the circuit forming copper plate 3 and etching was performed with an iron chloride solution to form a circuit pattern and the unwanted brazing material was removed from the marginal portions.

Figure 6A:
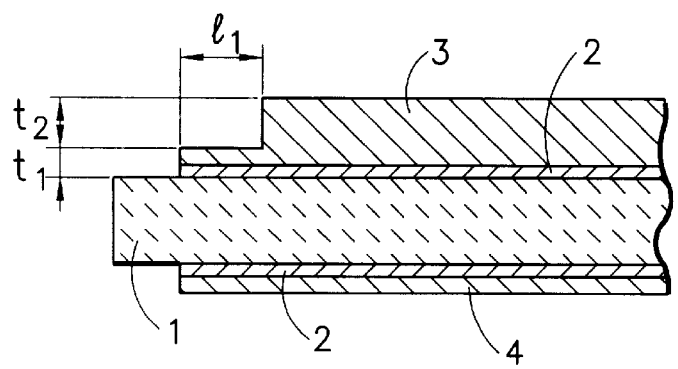
FIGS. 6A and 6B show in partial section the marginal profiles of the circuit boards fabricated in Comparative Example 2.
Figure 6B:
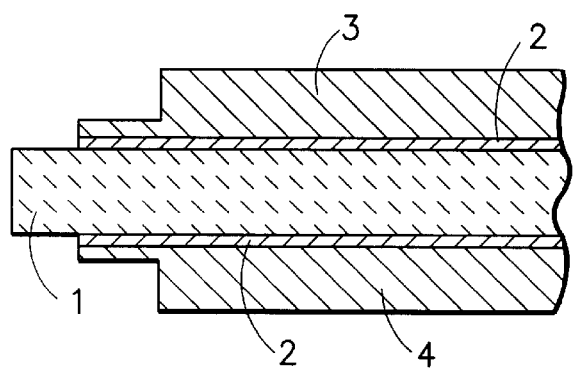

Then, in order to form a second marginal step, a second resist layer was applied over an area smaller than the Cu pattern and etching was performed with an iron chloride solution to fabricate two circuit boards having the marginal profiles shown in FIGS. 6A and 6B. The marginal steps had the following dimensions: $t_1=0.1$ mm and $l_1=0.3$ mm for the first step; and $t_2=0.2$ mm for the second step.

The two completed circuit boards, one having a marginal step on the heat dissipation side (FIG. 6B) and the other having not (FIG. 6A), were subjected to a heat cycle test and the results are also shown in Table 1. The stepless circuit board could withstand up to 300 cycles without cracking; however, fine cracks developed after 400 cycles. The other circuit board could withstand up to 400 cycles; however, fine cracks developed after 500 cycles.

COMPARATIVE EXAMPLE 3

Two alumina substrates measuring 53×29×0.635 mm were provided as ceramic substrates 1. Copper plates were placed in contact with opposite sides of each substrate, compressed together and heated at 1,063° C. in a nitrogen gas atmosphere to form a joint. An etching resist was applied to the circuit forming copper plate and etching was performed with an iron chloride solution to form a circuit pattern.

Figure 7:
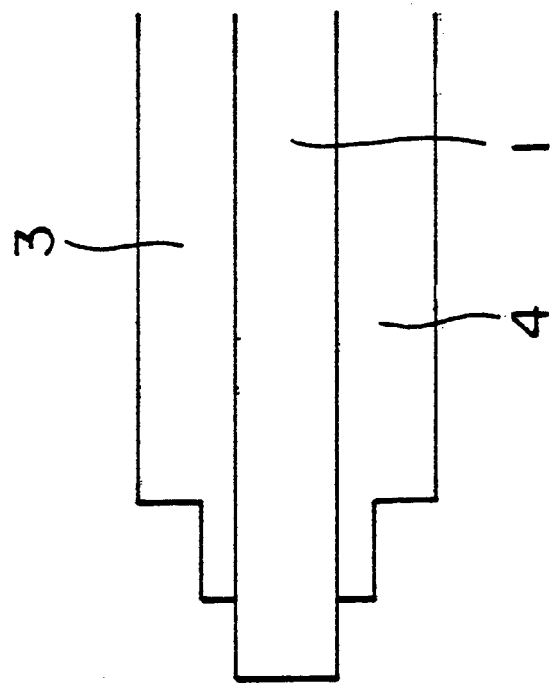
FIGS. 7A and 7B show in partial section the marginal profiles of the circuit boards fabricated in Comparative Example 3.
Figure 7:
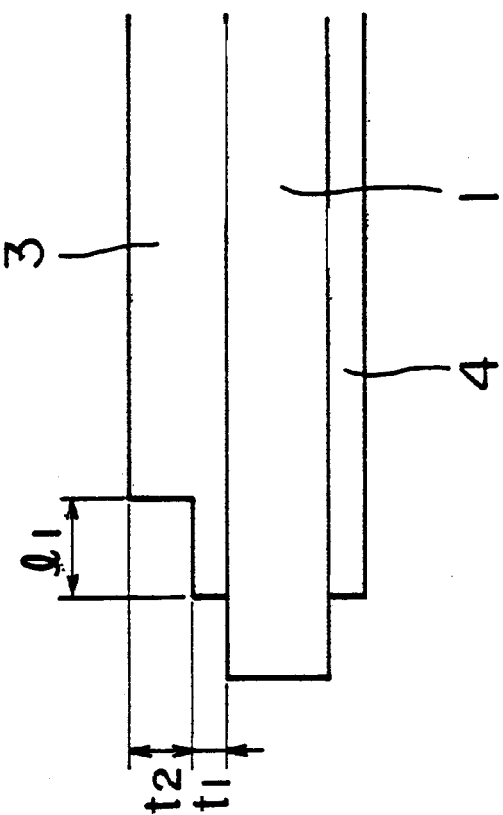

Then, in order to form a second marginal step, a second resist layer was applied over an area smaller than the Cu pattern and etching was performed with an iron chloride solution to fabricate two circuit boards having the marginal profiles shown in FIGS. 7A and 7B. The marginal steps had the following dimensions: $t_1=0.1$ mm and $l_1=0.3$ mm for the first step; and $t_2=0.2$ mm for the second step.

The two completed circuit boards, one having marginal step on the heat dissipation side (FIG. 7B) and the other having not (FIG. 7A), were subjected to a heat cycle test and the results are also shown in Table 1. The stepless circuit board could withstand up to 300 cycles without cracking; however, fine cracks developed after 400 cycles. The other circuit board could withstand up to 400 cycles; however, fine cracks developed after 500 cycles.

TABLE 1

Comparison Table for Heat Cycle Characteristics

| | | | | |
|---|---|---|---|---|
| Prior Art (Without marginal steps) | Active metal process | | about 50 cycles | (Comparative Example 1) |
| | Direct bonding process | | about 50 cycles | (Comparative Example 1) |
| Prior Art (with marginal steps) | Active metal process | Marginal steps on circuit side No marginal steps on heat dissipation side | 300 cycles | (Comparative Example 2) |
| | | Marginal steps on both circuit and heat dissipation sides | 400 cycles | (Comparative Example 2) |
| | Direct bonding process | Marginal steps on circit side No marginal steps on heat dissipation side | 300 cycles | (Comparative Exainple 3) |
| | | Marginal steps on both circuit and heat dissipation sides | 400 cycles | (Comparative Example 3) |
| Invention (with three marginal steps) | Active metal process | Three marginal steps on circuit side No marginal steps on heat dissipation side | 1,500 cycles | (Example 1, 3 and 7) |
| | | Three marginal steps on circuit side Two marginal steps on heat dissipation side | 2,000 cycles | (Example 2, 4 and 8) |
| | Direct bonding process | Three marginal steps on circuit side No marginal steps on heat dissipation side | 1,500 cycles | (Example 5) |
| | | Three marginal steps on circuit side Two marginal steps on heat dissipation side | 2,000 cycles | (Example 6) |

As described on the foregoing pages, the circuit board of the invention which has three or more steps formed in the marginal portions of at least the conductor circuit is significantly improved in heat cycle characteristics compared to the conventional version having no more than two marginal steps. Due to this great improvement in heat cycle characteristics, the circuit board of the invention can be used with power modules in automobiles, electric trains and other heretofore impractical applications that require high output power.

What is claimed is:

1. A semiconductor substrate of high reliability which comprises a ceramic to metal joined circuit board comprising a conductor circuit on a ceramic substrate, having three steps formed in marginal portions of at least the conductor circuit, wherein the lowest step formed in marginal portions of at least the conductor circuit has a thickness $t_1$ which accounts for no more than 15% of the total thickness of the conductor circuit and has a width $L_1$ of 5–500 μm, the middle step has a thickness $t_2$ which accounts for 25–55% of the total thickness of the conductor circuit and has a width $L_2$ of 100–500 μm, and the highest step has a thickness $t_3$ which accounts for 30–60% of the total thickness of the conductor circuit, which $t_1+t_2$ being no more than 70% of the total thickness of the conductor circuit and $L_1+L_2$ being no more than 1 mm.

2. The semiconductor substrate according to claim 1, wherein the lowest step formed in the marginal portions of at least the conductor circuit is made of an active metallic brazing material comprising an active metal, and the other steps are made of at least one metal.

3. The semiconductor substrate according to claim 1, wherein all of the steps formed in the marginal portions of at least the conductor circuit are made of at least one metal.

4. The semiconductor substrate according to claim 2, wherein the active metallic brazing material contains at least one active metal selected from the group consisting of Ti, Zr and Hf.

5. The semiconductor substrate according to claim 1, wherein the ceramic substrate is selected from the group consisting of an alumina substrate and a nitride ceramic substrate.

6. The semiconductor substrate according to claim 1, wherein the ceramic substrate is selected from the group consisting of alumina, aluminum nitride and silicon nitride.

7. The semiconductor substrate according to claim 6, wherein at least one step of the conductor circuit is formed of a copper plate.

8. The semiconductor substrate according to claim 1, wherein a circuit forming copper plate is joined to a first surface of the ceramic substrate and a heat dissipating copper plate is joined to a second surface of the ceramic substrate, which is opposite to said first surface.

9. The semiconductor substrate according to claim 8, wherein the ceramic substrate is an aluminum nitride substrate.

10. The semiconductor substrate according to claim 8, wherein the ceramic substrate is an alumina substrate.

11. The semiconductor substrate according to claim 1, wherein a circuit forming copper plate is joined to a first surface of the ceramic substrate and a heat dissipating copper plate is joined to a second surface of the ceramic substrate, which is opposite to said first surface and wherein the ceramic substrate is silicon nitride.

12. A semiconductor substrate of high reliability which comprises a ceramic to metal joined circuit board comprising a conductor circuit on a ceramic substrate, having three steps formed in marginal portions of at least the conductor circuit, wherein a circuit forming copper plate is joined to a first surface of the ceramic substrate and a heat dissipating copper plate is joined to a second surface of the ceramic substrate, which is opposite to said first surface, wherein the ceramic substrate is an aluminum nitride substrate, and the lowest step formed in marginal portions of at least the conductor circuit has a thickness $t_1$ which accounts for no more than 15% of the total thickness of the conductor circuit and has a width $L_1$ of 5–500 μm, the middle step has a thickness $t_2$ which accounts for 25–55% of the total thickness of the conductor circuit and has a width $L_2$ of 100–500 μm, and the highest step has a thickness $t_3$ which accounts for 30–60% of the total thickness of the conductor circuit, with $t_1+t_2$ being no more than 70% of the total thickness of the conductor circuit and $L_1+L_2$ being no more than 1 mm.

13. A semiconductor substrate of high reliability which comprises a ceramic to metal joined circuit board comprising a conductor circuit on a ceramic substrate, having three steps formed in marginal portions of at least the conductor circuit, wherein a circuit forming copper plate is joined to a first surface of the ceramic substrate and a heat dissipating copper plate is joined to a second surface of the ceramic substrate, which is opposite to said first surface, wherein the ceramic substrate is an alumina substrate, wherein the lowest step formed in marginal portions of at least the conductor circuit has a thickness $t_1$ which accounts for no more than 15% of the total thickness of the conductor circuit and has a width $L_1$ of 5–500 μm, the middle step has a thickness $t_2$ which accounts for 25–55% of the total thickness of the conductor circuit and has a width $L_2$ of 100–500 μm, and the highest step has a thickness $t_3$ which counts for 30–60% of the total thickness of the conductor circuit, with $t_1+t_2$ being no more than 70% of the total thickness of the conductor circuit and $L_1+L_2$ being no more than 1 mm.

* * * * *